(12) United States Patent
Mar

(10) Patent No.: US 6,466,072 B1
(45) Date of Patent: Oct. 15, 2002

(54) INTEGRATED CIRCUITRY FOR DISPLAY GENERATION

(75) Inventor: Monte F. Mar, Issaquah, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 65 days.

(21) Appl. No.: 09/050,548

(22) Filed: Mar. 30, 1998

(51) Int. Cl.[7] .............................................. H03F 11/26
(52) U.S. Cl. ................................. 327/280; 327/359
(58) Field of Search ............................. 327/356, 357, 327/359, 407, 408, 410, 411, 276–281

(56) References Cited

U.S. PATENT DOCUMENTS

| 4,546,275 A | * | 10/1985 | Pena-Finol et al. | 327/357 |
|---|---|---|---|---|
| 4,985,703 A | * | 1/1991 | Kaneyama | 327/408 |
| 5,115,409 A | * | 5/1992 | Stepp | 327/357 |
| 5,151,625 A | * | 9/1992 | Zarabadi et al. | 327/356 |
| 5,432,823 A | | 7/1995 | Gasbarro et al. | 375/356 |
| 5,754,073 A | * | 5/1998 | Kimura | 327/359 |
| 5,867,778 A | * | 2/1999 | Khoury et al. | 327/359 |
| 5,889,425 A | * | 3/1999 | Kimura | 327/359 |
| 5,959,491 A | * | 9/1999 | Kang | 327/359 |
| 5,999,804 A | * | 12/1999 | Forgues | 327/359 |
| 6,037,825 A | * | 3/2000 | Kung | 327/359 |
| 6,054,889 A | * | 4/2000 | Kobayashi | 327/359 |

* cited by examiner

*Primary Examiner*—Kenneth B. Wells
(74) *Attorney, Agent, or Firm*—Christopher P. Maiorana, P.C.

(57) ABSTRACT

An apparatus for combining stages of a multiplexer and a mixer into a single stage. The apparatus provides a first circuit configured to generate a first output signal in response to (i) one or more a input signals and (ii) one or more first select signals, a second circuit configured to generate a second output signal in response to (i) one or more a input signals and (ii) one or more second select signals, and a first and second mix signal configured to provide a third output signal in response to the first and second output signals. The third output signal provides a portion of the first and second output signals controlled by the first and second mix signals.

21 Claims, 4 Drawing Sheets

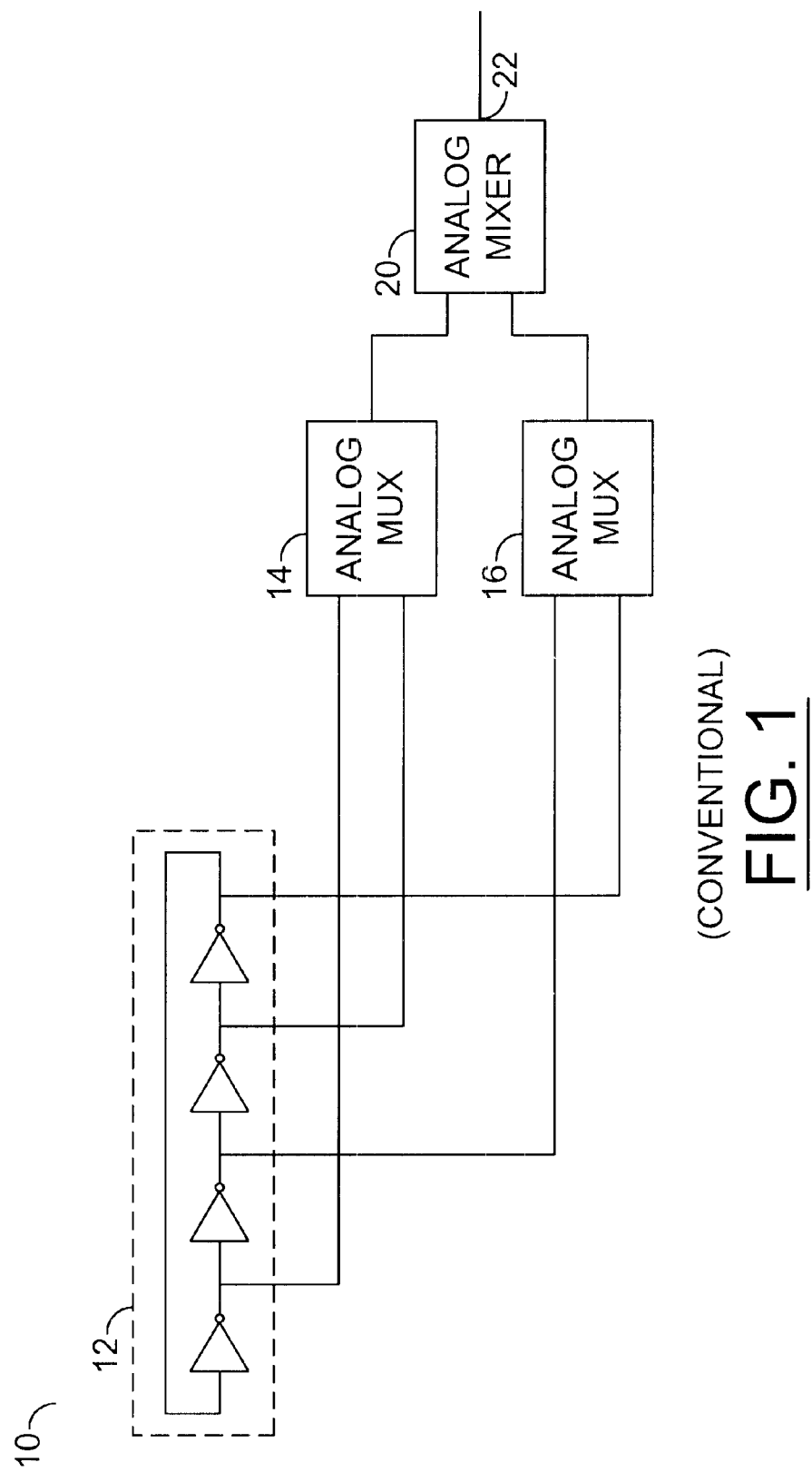
FIG. 1
(CONVENTIONAL)

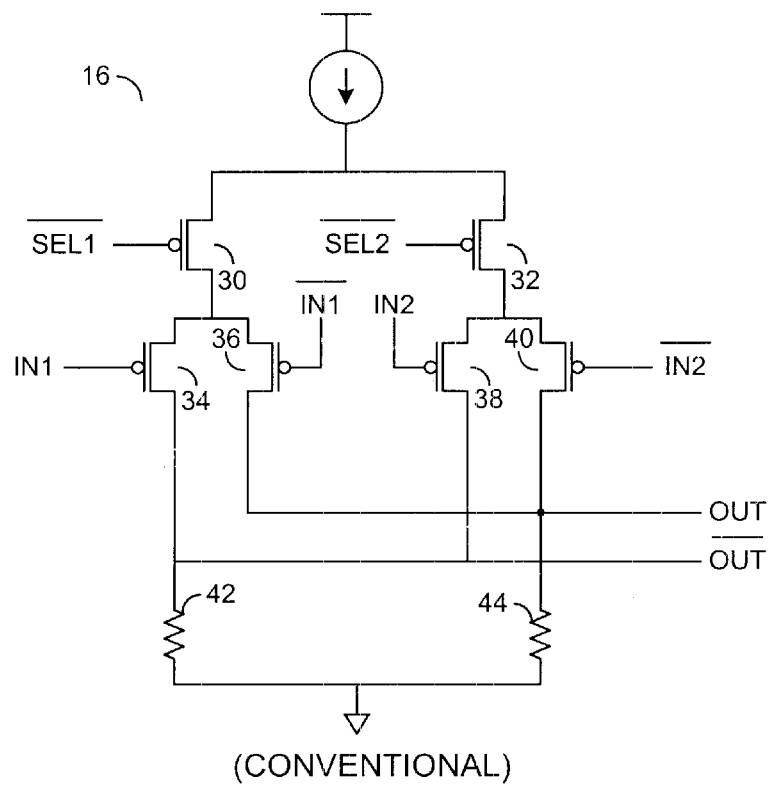
(CONVENTIONAL)
FIG. 2
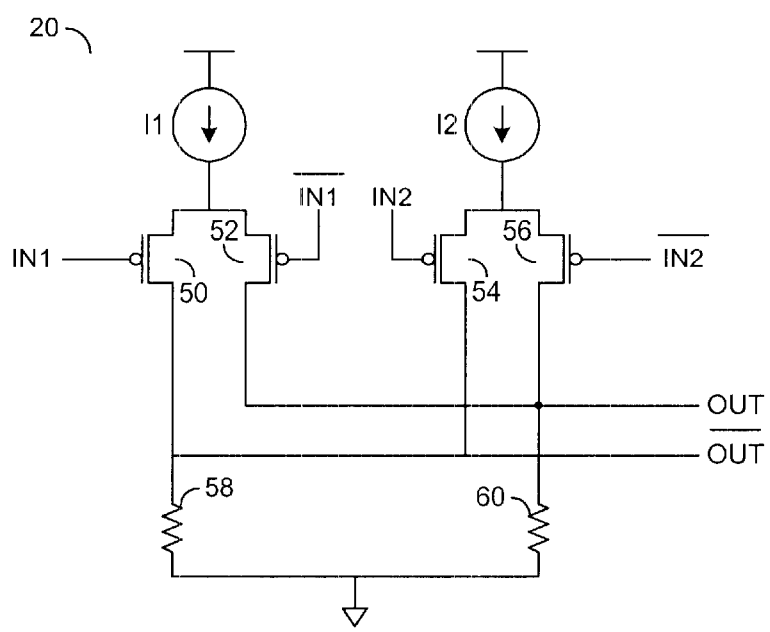
(CONVENTIONAL)
FIG. 3

US 6,466,072 B1

INTEGRATED CIRCUITRY FOR DISPLAY GENERATION

FIELD OF THE INVENTION

The present invention relates to delay circuits generally and, more particularly, to a delay circuit used with a voltage controlled oscillator to allow alternative phase steps to be implemented.

BACKGROUND OF THE INVENTION

Conventional approaches to implementing a delay generation circuit include tapping the oscillator to provide waveforms that are equally spaced in time given a reference period of operation. FIG. 1 illustrates a circuit 10 illustrating such a conventional approach. The circuit 10 generally comprises a ring oscillator 12, an analog multiplexer 14, an analog multiplexer 16 and an analog mixer 20. By correctly selecting the settings of the multiplexers 14 and 16, the two adjacent edges of the ring oscillator 12 can be supplied to the analog mixer 20. By controlling the mixer 20, a delay having a magnitude between the two edges supplied to the mixer 20 can be achieved.

While the circuit 10 may provide the desired output, it may also create a long output path from the ring oscillator 12 to an output 22 of the analog mixer 20. Additionally, by implementing two stages of analog devices (i.e., the analog multiplexers 14 and 16 and the analog mixer 20) circuit area and power consumption may be increased. Such an increase in power supply requirements may create additional sources that may inject jitter into the signal being mixed. The analog mixer 20 can also be affected by parasitic coupling when the multiplexers 14 and 16 are switched, which may lead to even larger contributions to signal jitter.

Referring to FIG. 2, a more detailed diagram of the analog multiplexer 14 (or 16) is shown. The analog multiplexer 14 shows differential inputs. The analog multiplexer 14 comprises a transistor 30, a transistor 32, a transistor 34, a transistor 36, a transistor 38, a transistor 40, a resistor 42 and a resistor 44. The transistors 30 and 32 receive select signals (i.e., SEL1b and SEL2b) at their respective gates. Only one of the transistors 30 or 32 is activated at a particular time, otherwise mixing of the signals would occur, which is not consistent with the function of a multiplexer. The multiplexer 16 generally presents a signal OUT and a complement signal OUTb that correspond to one of the input signals IN1 and IN2. The signals OUT and OUTb are selected in response to the select signals SEL1b and SEL2b.

Referring to FIG. 3, an example of an analog mixer 20 is shown. The analog mixer 20 generally comprises a current source I1, a current source I2, a transistor 50, a transistor 52, a transistor 54, a transistor 56, a transistor 58 and a transistor 60. The mixer 20 presents an output OUT and a complement output OUTb. The mixer 20 generally includes a parasitic capacitance between the input nodes (e.g., IN1 and IN2) and the output nodes (e.g., OUT and OUT). In an ideal implementation, no signal would leak from the input IN2 to the output OUT. However, the parasitic capacitance couples a portion of the signal IN2 to the output. The parasitic coupling can create jitter if the signal on IN2 is switched, as it might be when the multiplexer 20 is switched in a typical operation. In addition, in the implementation shown in FIG. 1, the outputs of the mixer 20 (i.e., OUT and OUTb) may add more noise in a system that is already susceptible to noise injection.

SUMMARY OF THE INVENTION

The present invention concerns an apparatus for combining stages of a multiplexer and a mixer into a single stage. The apparatus comprises a first circuit configured to generate a first output signal in response to (i) one or more a input signals and (ii) one or more first select signals, a second circuit configured to generate a second output signal in response to (i) one or more input signals and (ii) one or more second select signals, and a first and second mix signal configured to provide a third output signal in response to the first and second output signals. The third output signal comprises a portion of the first and second output signals controlled by the first and second mix signals.

The objects, features and advantages of the present invention include providing a circuit that combines features a multiplexer and a mixer to (i) eliminate one stage or circuitry, (ii) save in the power consumption of the circuit and (iii) save in the area required to the implement the circuit. Since fewer nodes may be required, the chance of jitter introduction is reduced. Additionally, coupling from an input to the output does not change in response to the particular input selected.

BRIEF DESCRIPTION OF THE DRAWINGS

These and other objects, features and advantages of the present invention will be apparent from the following detailed description and the appended claims and drawings in which:

FIG. 1 is a block diagram of a conventional ring oscillator;

FIG. 2 is a circuit diagram of a conventional analog multiplexer;

FIG. 3 is a circuit diagram of a conventional analog mixer;

DETAILED DESCRIPTION OF THE PREFERRED EMBODIMENTS

Figure 4:
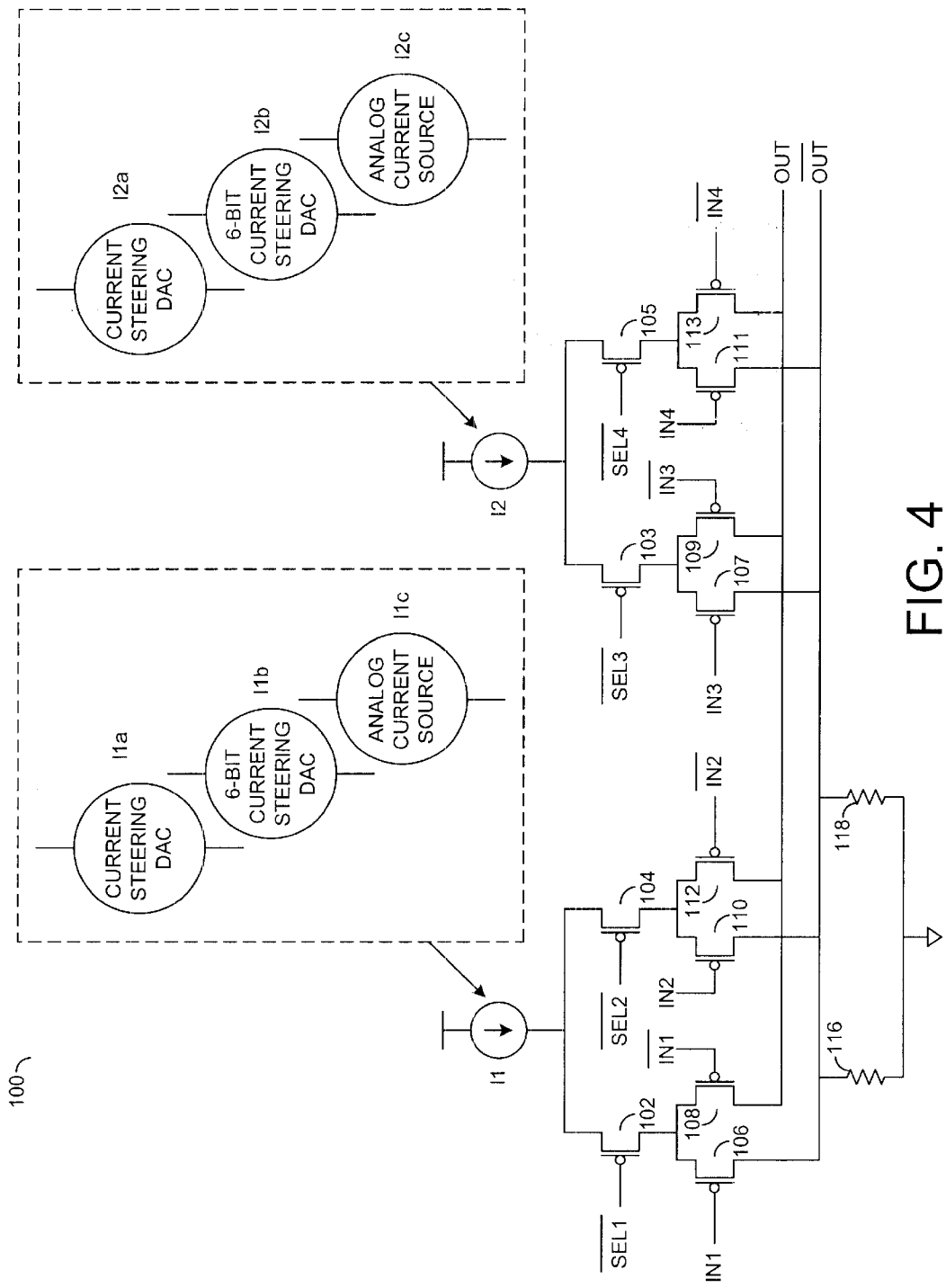
FIG. 4 is a circuit diagram of a preferred embodiment of the present invention.

Referring to FIG. 4, a diagram of a circuit 100 is shown in accordance with a preferred embodiment of the present invention. The circuit 100 generally comprises a current source I1, a current source I2, a transistor 102, a transistor 103, a transistor 104, a transistor 105, a transistor 106, a transistor 107, a transistor 108, a transistor 109, a transistor 110, transistor 112, a transistor 111, a transistor 113, a resistor 116 and a resistor 118.

The current source Ii may be coupled to a source of the transistor 102 as well as to a source of the transistor 104. The current source may be implemented, in one example, as current-steering digital-to-analog converter (DAC). In one embodiment, the current source may be implemented as a 6-bit current-steering DAC. However, other resolutions (e.g., greater than or less than 6-bit) DACs may be implemented in order to meet the design criteria of a particular application.

The drain of the transistor 102 is generally coupled to a source of the transistor 106 and a source of the transistor 108. The drain of the transistor 106 is generally coupled to ground (through the resistor 116) as well as to the output OUTb. The drain of the transistor 108 is generally coupled to ground (through the resistor 118) as well as to the output OUT. The drain of the transistor 104 is generally coupled to the source of the transistor 110 as well as to the source of the transistor 112. The drain of the transistor 110 is generally coupled to ground (through the resistor 116) as well as to the output OUTb. The drain of the transistor 112 is generally coupled to ground (through the resistor 118) as well as to the output OUT. The transistors 102 and 104 are generally select transistors that each receive a select signal (e.g., SEL1b and SEL2b), respectively. The select signals SEL1b and SEL2b are generally active low signals. The transistor 106 generally has a gate that receives an input signal (e.g., IN1). The transistor 108 generally has a gate that receives an input signal (e.g., IN1b), which is a complement signal of the signal IN1. The transistor 110 generally has a gate that receives an input signal (e.g., IN2). The transistor 112 generally has a gate that receives an input signal (e.g., IN2b), which is a complement signal of the signal IN2.

The transistors 103, 105, 107, 109, 111 and 113 have a similar configuration to the transistors 102, 104, 106, 108, 110 and 112. Specifically, the transistors 103 and 105 generally have sources that are coupled to the current source I2. The drain of the transistor 103 is generally coupled to the sources of the transistors 107 and 108. The drain of the transistor 109 is generally coupled to ground (through the resistor 118) and to the output OUT. The drain of the transistor 107 is generally coupled to ground (through the resistor 116) as well as to the signal OUTb. The transistor 105 generally has a drain that is coupled to the sources of the transistors 111 and 113. The drain of the transistor 111 is generally coupled to ground (through the resistor 116) as well as to the output OUTb. The drain of the transistor 113 is generally coupled to ground (through the resistor 118) as well as to the output OUT. The transistors 103 and 105 (and the transistors 102 and 104) may be implemented as one or more transistors. Additional inputs may be implemented along with supporting circuitry. For example, four sets of inputs may be implemented in a particular implementation. In another implementation, more than four sets of inputs may be implemented. While the circuit 100 is shown implemented with PMOS devices, NMOS devices (with a corresponding active logic adjustment) may be implemented to meet the design criteria of a particular application.

The transistor 103 generally has a gate that receives a select signal (e.g., SEL3b), similar to the select signal SEL1b received at the gate of the transistor 102. The transistor 105 generally has a gate that receives a select signal (e.g., SEL4b), which is similar to the signal received at the gate of the transistor 104. The select signal pairs SEL1b and SEL2b and the select signal pairs SEL3b and SEL4b may be the same signals or may be different signals. The transistor 107 has a gate that may receive an input signal (e.g., IN4). The transistor 109 has a gate that generally receives an input signal (e.g., IN3b), which is a complement signal of the signal IN3. The transistor 111 has a gate that generally receives an input signal (e.g., IN3). The transistor 113 has a gate that generally receives an input signal (e.g., IN4b) that is a complement of the signal IN4. The input signal IN1 and the input signal IN3 may be the same signal or may be different signals. The input signal IN2 and the input signal IN4 may be the same signal or may be different signals.

The resistor load (e.g, the resistors 116 and 118) for the differential pairs may be implemented as a diode connected NMOS device and a parallel NMOS device. The gate for the parallel device may be. controlled externally. An external circuit (not shown) may regulate both the sum of the currents I1 and I2 and the transistors to maintain a swing size that is constant within a predetermined design parameter (e.g., +/−5%, +/−10%, etc.). If the resistors 116 and 118 are implemented as physical resistors, then only the currents I2 and I2 may need to be regulated.

The current sources I1 and I2 may operate as mix signals that generally control the mix between the signal selected by the select signal SEL1b or SEL2b and the signal selected by the select signal SEL3b or SEL4b. The outputs OUT and OUTb may be defined by a ratio of the respective strengths of current sources I1 and I2. The overall current of the current sources I1 and I2 is generally designed to be equal to a constant value. For example, as the current source I1 increases (to increase the level of the mix of the signal selected by the select signal SEL1b or SEL2b) the current source I2 generally decreases (to decrease the level of the mix of the signal selected by the select signal SEL3b or SEL4b). Since the overall current of the current sources I1 and I2 generally remains constant, the logic level of the signal OUT or OUTb generally remains within a particular operating voltage range (e.g., 3.3V, 2.5V, 1.8V, etc.).

Various design alternatives may be implemented for the components of FIG. 4. For example, the current sources I1 and I2 may be used to control the mixing, which may generate a phase offset. The multiplexers (e.g., the transistors 102 and 104 or the transistors 103 and 105) may provide a coarser level of control. When the multiplexers are combined with the current sources I1 and I2, the phase can be advanced (or retarded) arbitrarily at a roughly fixed step size. Additionally, the current sources may be implemented as analog devices. However, with analog devices, the advantages of a quantized step size as provided by a DAC may be lost. Another alternative may be to implement a single DAC, where the current that is not used in one current source (e.g., I1) may be directed to the other current source (e.g., I2). This may be possible since the overall design constraint is for the sum of the currents to be constant. The implementation of a single DAC may save on power consumption and area.

Figure 5:
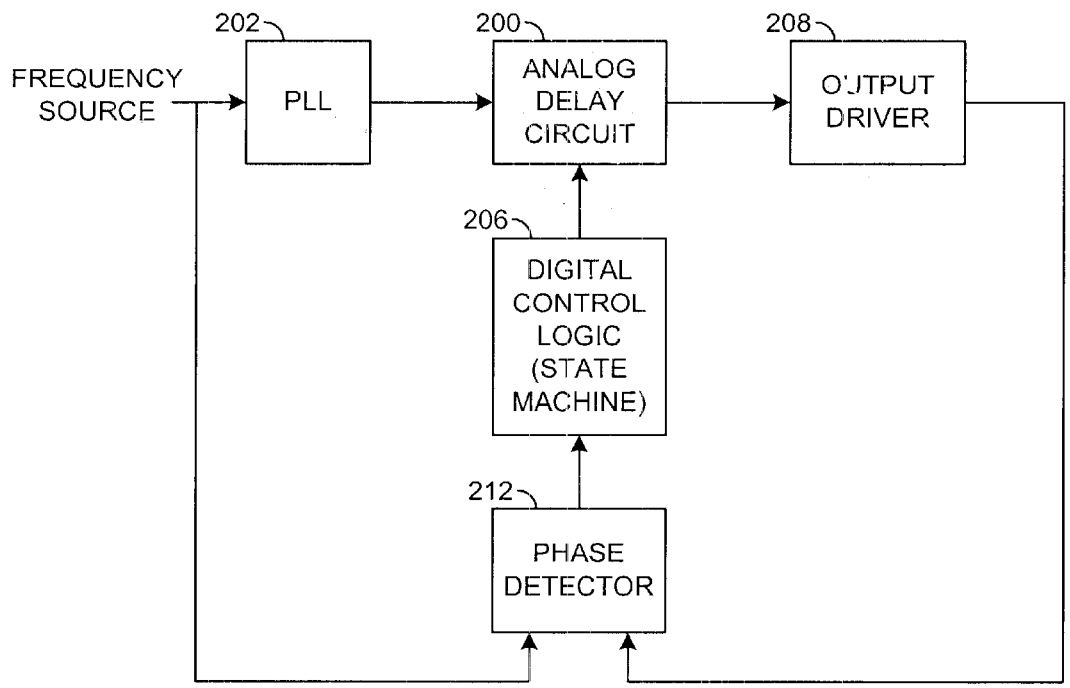
FIG. 5 is a block diagram illustrating an implementation of the present invention in an analog delay circuit.

Referring to FIG. 5, a block diagram illustrating an implementation of the present invention in an analog delay circuit 200 is shown. The delay circuit generally comprises a phase locked loop 202, a digital control logic block (or circuit) 206, an output driver block (or circuit) 208, a phase detector 212 and the circuit 100. The digital control logic block 206 provides signals to the analog delay circuit 100 to control the selection of the inputs as well as the mix between the two selected signals. In one example, the digital control logic block 206 may be implemented as a state machine. The phase offset at the inputs to the phase detector 212 are generally driven to zero by the feedback loop. The information from the phase detector 212 may be used to control the control logic 206 so that the correct phase offset is correct to achieve deskewing. The PLL 202 may be configured to multiply the input frequency. The logic 206 generally ensures that certain rising edges are aligned to provide a deskewed clock at the inputs of the phase detector 212.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a first differential output signal in response to (i) a plurality of first differential input signals, (ii) a plurality of first select signals, and (iii) a first mix signal;
    a second circuit configured to generate a second differential output signal in response to (i) a plurality of second differential input signals, (ii) a plurality of second select signals, and (iii) a second mix signal; and a first current source and a second current source configured to (i) generate said first and second mix signals and (ii) provide a third differential output signal in response to said first and said second differential output signals, wherein said third differential output signal comprises a combination of said first and second differential output signals controlled by said first and second mix signals.

2. The apparatus according to claim 1, wherein said first and second current sources comprise digital-to-analog converters (DACs).

3. The apparatus according to claim 1, wherein said first and second current sources comprise current-steering digital-to-analog converters (DACs).

4. The apparatus according to claim 1, wherein said third output signal is defined by a ratio of said first and second mix signals.

5. The apparatus according to claim 1, wherein one or more of said first input signals are equal to one or more of said second input signals.

6. The apparatus according to claim 1, wherein one or more of said first input signals are different than one or more of said second input signals.

7. The apparatus according to claim 1, wherein said first select signals and said second select signals are generated by a digital control circuit.

8. The apparatus according to claim 7, wherein said digital control circuit comprises a state machine.

9. The apparatus according to claim 4, wherein a magnitude of the combination of said first and second mix signals is a constant.

10. An analog delay circuit comprising the apparatus of claim 1.

11. A phase lock loop circuit comprising the apparatus of claim 1.

12. An apparatus comprising:
means for generating a first differential output signal in response to (i) a plurality of first differential input signals, (ii) a plurality of first select signals, and (iii) a first mix signal;
means for generating a second differential output signal in response to (i) a plurality of second differential input signals, (ii) a plurality of second select signals, and (iii) a second mix signal; and
means for generating a first and a second mix signal configured to provide a third differential output signal in response to said first and second differential output signals, wherein said third differential output signal comprises a combination of said first and second differential output signals controlled by said first and second mix signals.

13. A method for generating a delay comprising the steps of:
generating a first differential output signal in response to (i) a plurality of first differential input signals, (ii) a plurality of first select signals, and a first mix signal;
generating a second output signal in response to (i) a plurality of second differential input signals, (ii) a plurality of second select signals, and a second mix signal;
generating said first and second mix signals; and
generating a third differential output signal in response to said first and second differential output signals, wherein said third differential output signal comprises a combination of said first and second differential output signals controlled by said first and second mix signals.

14. The method according to claim 13, further comprising the step of generating said first and second mix signals with current sources comprising digital-to-analog converters (DACs).

15. The method according to claim 13, further comprising the step of generating said first and second mix signals with current sources comprising current-steering digital-to-analog converters (DACs).

16. The method according to claim 13, further comprising the step of controlling a ratio of said first and second mix signals.

17. The method according to claim 13, wherein one or more of said first input signals are equal to one or more of said second input signals.

18. The method according to claim 13, wherein one or more of said first input signals are different than one or more of said second input signals.

19. The apparatus according to claim 13 further comprising the step of:
generating said first select signals and said second select signals with a digital control circuit.

20. The method according to claim 13 further comprising the step of:
generating said first select signals and said second select signals with a state machine.

21. The method according to claim 16, wherein a sum of said first and second mix signals is equal to a constant.

* * * * *